US008331577B2

(12) United States Patent
Lyon et al.

(10) Patent No.: US 8,331,577 B2
(45) Date of Patent: Dec. 11, 2012

(54) ELECTRONIC DEVICE HAVING ACTIVE NOISE CONTROL WITH AN EXTERNAL SENSOR

(75) Inventors: Geoff Lyon, Menlo Park, CA (US); Mehrban Jam, Fremont, CA (US); Ian N Robinson, Pebble Beach, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1093 days.

(21) Appl. No.: 12/250,982

(22) Filed: Oct. 14, 2008

(65) Prior Publication Data

US 2010/0002890 A1 Jan. 7, 2010

Related U.S. Application Data

(60) Provisional application No. 61/078,025, filed on Jul. 3, 2008.

(51) Int. Cl.

| | |
|---|---|
| ***G10K 11/175*** | (2006.01) |
| ***G10K 11/178*** | (2006.01) |
| ***F01N 1/06*** | (2006.01) |
| *G10K 11/00* | (2006.01) |
| *H03B 29/00* | (2006.01) |
| *F01N 1/00* | (2006.01) |

(52) U.S. Cl. ..................... 381/71.5; 381/71.1; 381/71.3; 181/206

(58) Field of Classification Search ................. 381/71.5, 381/71.1, 71.2, 71.4, 71.3; 181/206, 224, 181/225, 226

See application file for complete search history.

(56) References Cited

U.S. PATENT DOCUMENTS

| | | | | | |
|---|---|---|---|---|---|
| 4,665,549 | A | * | 5/1987 | Eriksson et al. | 381/71.5 |
| 4,805,733 | A | * | 2/1989 | Kato et al. | 181/206 |
| 5,097,923 | A | * | 3/1992 | Ziegler et al. | 181/206 |
| 5,224,168 | A | * | 6/1993 | Martinez et al. | 381/71.8 |
| 5,278,780 | A | * | 1/1994 | Eguchi | 708/322 |
| 5,347,586 | A | * | 9/1994 | Hill et al. | 381/71.8 |
| 5,359,662 | A | * | 10/1994 | Yuan et al. | 381/71.14 |
| 5,386,689 | A | * | 2/1995 | Bozich et al. | 60/803 |
| 5,414,775 | A | * | 5/1995 | Scribner et al. | 381/71.2 |
| 5,431,008 | A | * | 7/1995 | Ross et al. | 60/803 |
| 5,445,517 | A | * | 8/1995 | Kondou et al. | 431/18 |
| 5,475,761 | A | * | 12/1995 | Eatwell | 381/71.11 |
| 5,478,199 | A | * | 12/1995 | Gliebe | 415/119 |
| 5,499,302 | A | * | 3/1996 | Nagami et al. | 381/71.4 |
| 5,499,423 | A | * | 3/1996 | Joo et al. | 15/319 |
| 5,502,869 | A | * | 4/1996 | Smith et al. | 15/326 |
| 5,511,127 | A | * | 4/1996 | Warnaka | 381/71.5 |
| 5,517,571 | A | * | 5/1996 | Saruta et al. | 381/71.11 |

(Continued)

FOREIGN PATENT DOCUMENTS

JP 05046188 A * 2/1993

(Continued)

*Primary Examiner* — Edgardo San Martin

(57) ABSTRACT

An electronic device includes an enclosure for the electronic device and a duct extending from an interior to an exterior of the enclosure to exhaust airflow from the enclosure. The electronic device further includes an active noise control mechanism. The active noise control mechanism includes an internal sensor, an external sensor, and an acoustic wave generator. The internal sensor is arranged within the enclosure to sense a noise and generate an internal sensor output, and the external sensor is arranged outside of the enclosure to detect sounds and generate an external sensor output. Based on the internal sensor output and the external sensor output, the acoustic wave generator generates an acoustic wave within the duct to reduce the noise.

13 Claims, 7 Drawing Sheets

U.S. PATENT DOCUMENTS 5,583,943 A * 12/1996 Ohashi et al. ................ 381/71.5
5,602,926 A * 2/1997 Ohashi et al. ................ 381/71.5
5,617,479 A * 4/1997 Hildebrand et al. ......... 381/71.3
5,636,286 A * 6/1997 Makabe et al. .............. 381/71.5
5,666,427 A * 9/1997 Kim et al. .................... 381/71.1
5,668,747 A * 9/1997 Ohashi .......................... 708/322
5,689,572 A * 11/1997 Ohki et al. ................... 381/71.3
5,692,053 A * 11/1997 Fuller et al. .................. 381/71.3
5,748,750 A * 5/1998 L'Esperance et al. ....... 381/71.5
5,790,673 A * 8/1998 Gossman ..................... 381/71.1
5,805,714 A * 9/1998 Kasama et al. .............. 381/71.8
6,049,615 A * 4/2000 Chou et al. ................... 381/71.3
6,160,892 A * 12/2000 Ver ............................. 381/71.5
6,327,368 B1 * 12/2001 Yamaguchi et al. ......... 381/71.5
7,047,111 B2 * 5/2006 Schliep et al. .................... 701/2
7,103,188 B1 * 9/2006 Jones ........................... 381/71.9
7,106,866 B2 * 9/2006 Astorino et al. ............. 381/71.4
7,286,907 B2 * 10/2007 Schanin et al. ............... 700/300
7,353,908 B1 * 4/2008 French .......................... 181/206
7,724,515 B2 * 5/2010 Fukuda et al. ............. 361/679.5
7,783,055 B2 * 8/2010 Barath et al. ................. 381/71.3
7,853,024 B2 * 12/2010 Slapak et al. ................ 381/71.1
7,891,354 B2 * 2/2011 Farbarik ................... 128/204.21
7,894,613 B1 * 2/2011 Ong et al. .................... 381/71.3
7,995,769 B2 * 8/2011 Nakane ........................ 381/71.1
8,054,984 B2 * 11/2011 Klossowski ................. 381/71.3
8,085,945 B2 * 12/2011 Su et al. ....................... 381/71.3
2002/0039423 A1 * 4/2002 Daly ............................ 381/71.5
2005/0276422 A1 * 12/2005 Buswell et al. ............ 381/71.14
2006/0039569 A1 * 2/2006 Antaki ......................... 381/71.1
2007/0223715 A1 * 9/2007 Barath et al. ................. 381/71.7
2008/0144851 A1 * 6/2008 Kim ............................. 381/71.5
2008/0196967 A1 * 8/2008 Breitbach et al. ............. 181/206
2009/0034746 A1 * 2/2009 Nozaki ........................ 381/71.1
2009/0092262 A1 * 4/2009 Costa et al. .................. 381/71.1
2010/0002385 A1 * 1/2010 Lyon et al. .................... 361/695
2010/0002892 A1 * 1/2010 Togawa et al. ............. 381/71.12
2010/0310083 A1 * 12/2010 Sonnde ........................ 381/71.1

FOREIGN PATENT DOCUMENTS

JP 06161474 A * 6/1994

* cited by examiner

ELECTRONIC DEVICE HAVING ACTIVE NOISE CONTROL WITH AN EXTERNAL SENSOR

CROSS-REFERENCES

The present application claims priority from provisional application Ser. No. 61/078,025, filed Jul. 3, 2008, the contents of which are incorporated herein by reference in their entirety.

This application is related to copending and commonly assigned Provisional U.S. Patent Application Ser. No. 61/078,016, entitled "ELECTRONIC DEVICE HAVING ACTIVE NOISE CONTROL AND A PORT ENDING WITH CURVED LIPS," filed by the same inventors to this instant patent application on TBD, the disclosure of which is hereby incorporated by reference in its entirety.

BACKGROUND

Rotating devices, such as cooling fans and disk drives, in a computer system emit acoustic noise that is undesirable. Cooling fans in general generate a periodic noise known as a blade passing frequency (BPF), a noise that is generated at the tip of blades.

The acoustic noise can be disturbing and even damaging in environments such as datacenters, which contain many high performance fans. The acoustic noise has also been found to be highly distracting in quiet environments like a home theater where, for example, a media computer is deployed.

A conventional way to remove fan noise has been through the use of passive noise control mechanisms. One conventional, passive noise control mechanism contains no fans but instead uses relatively large amounts of copper, heat pipes, heat sinks, etc. to adequately cool computer system components. However, due to the amount of materials required to implement the passive noise control mechanism, such a solution has often been expensive to implement.

Another conventional, passive noise control mechanism uses specially designed large and low-speed fans to shift the BPF into lower frequency bands, where the fan noise is less disturbing to human ears. Still another conventional way to passively control noise has been through the use of suitable noise absorbing materials and mounting components with suitable fasteners to reduce vibration and noise and thus avoid the so-called "tuning fork effect." In general, the use of noise absorbing materials tends to be more effective at reducing higher frequency noise components, but less effective at eliminating lower frequency noise.

Yet another conventional way to passively control noise has been through careful selection and placement of individual components to reduce unwanted noise. For example, the use of low-noise cooling fans with precision low noise bearings and tuned blade shaping has become popular.

While the above discussed conventional, passive noise control mechanisms are available, they are often costly and/or ineffective.

A further approach at reducing fan noise is through active noise control (ANC), which is a technique used to reduce noise and vibrations emanating from electronic devices, such as projectors and large printers, machinery, air ducts and other industrial equipment. An example of a conventional ANC system 100 is depicted in FIG. 1. As shown, the ANC system 100 includes a reference microphone 120 to detect a noise. The reference microphone 120 is connected to a control electronics 130, which is connected to a speaker 150. The speaker 150 provides anti-noise to reduce/counter the noise detected by the reference microphone 120. The ANC system 100 also includes an error microphone 140, which is used to detect the result of the noise-reduction and provides the detected result to the control electronics 130. The control electronics 130 may use the result received from the error microphone 140 to vary operation of the speaker 150.

Conventional forms of ANC have been applied to certain consumer devices, the most popular being noise canceling headphones, where the external noise is reduced within the controlled zone of each ear-cup. Other applications where ANC has been applied include air-conditioning ducts, projectors, and large printers. However, in general, implementation of ANC in such systems is difficult because of the algorithmic complexity of the ANC and additional costs incurred with increases in the size of the enclosures housing the apparatuses. The more open the solution space and thus the size of the noise field being reduced, the less effective ANC becomes and the algorithmic complexity and costs also increase.

Although there have been recent attempts to reduce noise generated in electronic devices, such attempts have proven to be less than successful because the proposed solutions are inefficient in managing power and/or have inefficient ANC algorithms.

BRIEF DESCRIPTION OF DRAWINGS

The embodiments of the invention will be described in detail in the following description with reference to the following figures.

DETAILED DESCRIPTION OF EMBODIMENTS

Figure 1:
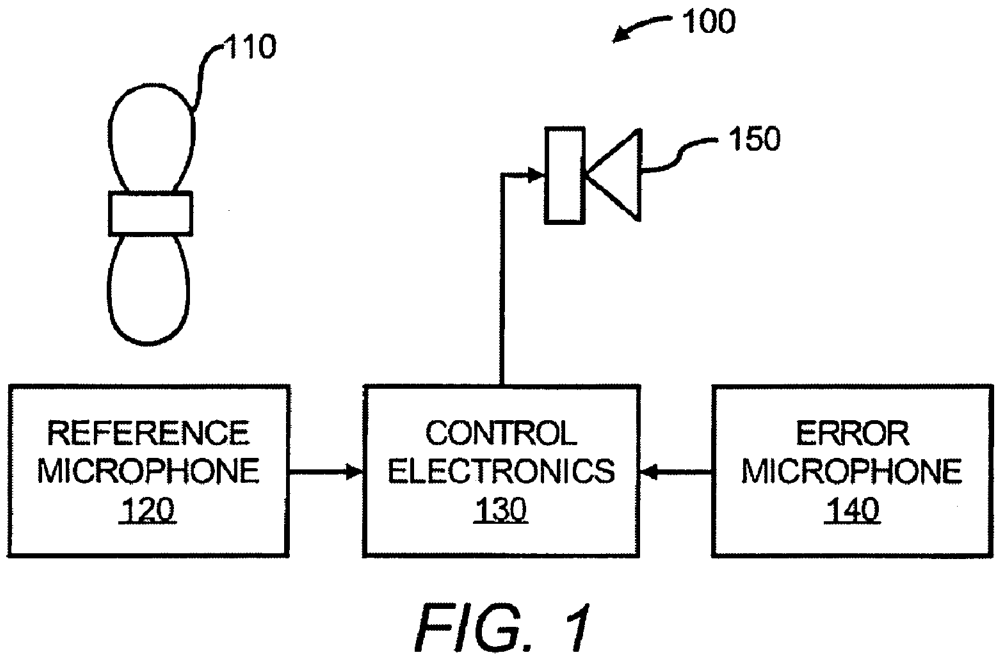
FIG. 1 (PRIOR ART)
FIG. 1 illustrates a conventional ANC system.

For simplicity and illustrative purposes, the principles of the embodiments are described by referring mainly to examples thereof. In the following description, numerous specific details are set forth in order to provide a thorough understanding of the embodiments. It will be apparent, however, to one of ordinary skill in the art, that the embodiments may be practiced without limitation to these specific details. In some instances, well known methods and structures have not been described in detail so as not to unnecessarily obscure the embodiments.

Cooling fans in general generate a periodic noise known as a blade passing frequency (BPF). BPF is a noise that is generated at the tip of the fan blades. Cooling fans also generate a broadband noise that is mostly generated by consistent, laminar airflow. BPF is characterized by a distinctive high pitch whine and is generally the more annoying of the two noises. Once the BPF noise escapes into an open space outside the enclosure of electronic devices, it becomes very difficult to reduce/counter it. Thus, it is beneficial to have some control over the noise before it escapes from the electronic device enclosures.

Applying active noise control (ANC) in electronic devices, such as computers (for instance, desktop computers and notebook computers), enables use of relatively inexpensive commodity components to achieve the equivalent acoustic result of using more expensive passive component configurations. For example, according to an example, noise may be reduced by actively reducing the signature of the noise, for instance, the largest spectral components of the noise, as described in greater detail herein below.

ANC in general is more effective at reducing the higher BPF frequencies associated with small high speed fans typically employed in servers and high performance machines with space restrictions, but is generally less effective at reducing the broadband noise generated by the air rush. One reason for that is that noise canceling algorithms are typically more effective at reducing noises at higher frequencies.

According to an example, ANC algorithms may be optimized to reduce noise at the location of ANC system components. According to another example, ANC algorithms may be optimized to reduce noise at a target location different from the location of ANC system components. For instance, the ANC system may be used to reduce noise in a relatively larger space (for instance, enclosures of computers) than in the first example, such that the ANC algorithms may need to reduce noise at a target location outside the location of ANC system components. Further, while ANC algorithms may be more complicated, when a user is located at some distance away from the location of ANC system components, the ANC algorithms may be optimized to reduce noise at the location of the user. In the latter example involving noise reduction at a target location different from the location of ANC system components, the ANC system may characterize and/or forecast noise at the target location by using one or more assumptions about the noise.

Disclosed herein are systems and methods that implement ANC in electronic devices in efficient, power-saving ways by using an external microphone to detect sounds outside an enclosure of an electronic device, using a feed from a source outputting an audio signal to a speaker for a purposeful generation of user sounds, a sound amplitude threshold, having an external microphone affixed to an exterior of the enclosure, and/or having an external sensor located inside a portable electronic device.

Figure 2A:
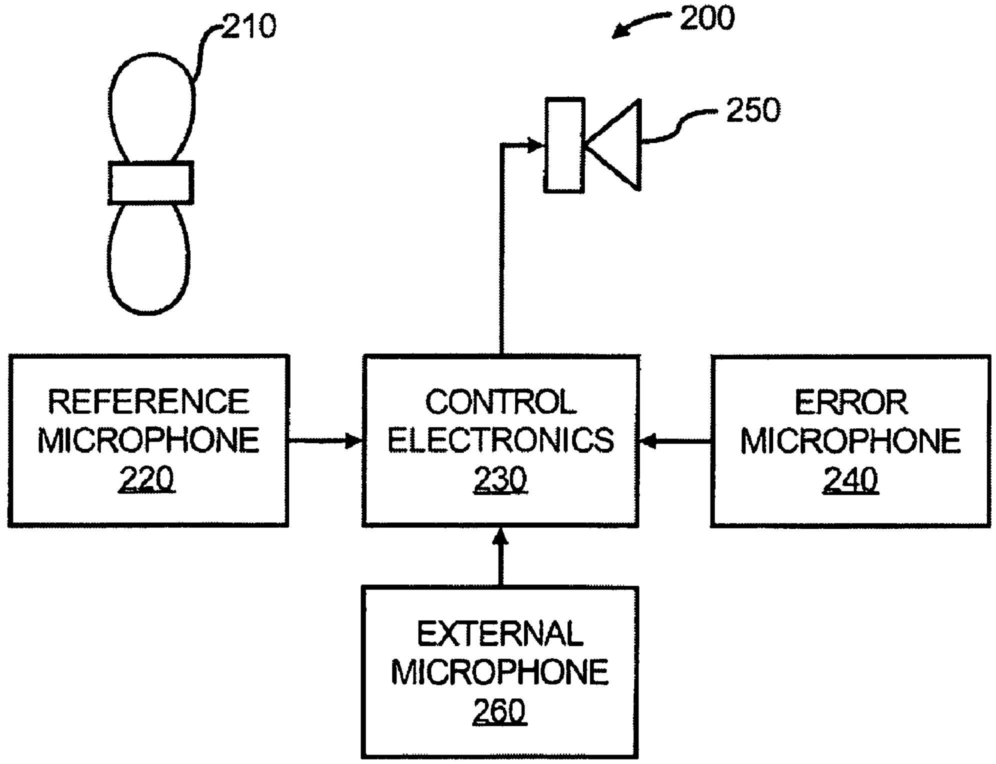
FIG. 2A illustrates an ANC system according to an exemplary embodiment of the invention.

With reference first to FIG. 2A, an ANC system 200 may be employed in an electronic device to reduce noise emanating from one or more rotating devices 210, such as cooling fans, disk drives, etc., contained in the electronic device. More particularly, for instance, a fan 210 may be used to create an airflow for cooling components of an electronic device and may be a typical source of acoustic noise. In another example, another mechanism may be used to create an airflow and an element other than a fan, for instance, a disk drive, may be a typical source of acoustic noise. In any case, a reference microphone 220 may be located near or far from the source of noise and may capture the noise. An error microphone 240 may detect the amount of combined fan noise and anti-noise generated by a speaker 250 and provide a signal corresponding to the combined amount, which corresponds to the differential between the noise and the anti-noise, as an error signal to a control electronics 230.

In addition to using the microphones 220 and 240, one or more external microphone(s) 260 arranged outside of an enclosure of an electronic device may be used to detect sounds for the ANC system 200. By detecting sounds with the external microphone, a measure of ambient sound is provided. The external microphone 260 also detects and provides a measure of the effectiveness of the ANC system 200 in reducing noise emanating from one or more rotating devices in the electronic device.

According to an example, to provide a measure of ambient sounds, the external microphone 260 may operate as a simple threshold device, which generates a signal in response to its detection of loud sounds with amplitudes that exceed a sound amplitude threshold of the external microphone 260. In another example, the external microphone 260 may output a signal representing sounds detected by the external microphone 260 in digital format. A signal representing sounds in digital format may be generated by generating more or less a mirror image of the signal in digital format. Also, the signal representing detected sounds in digital format may be generated by generating codes indicating which sounds in a look-up table of various sounds correspond to the detected sounds. In the latter case for generating a signal representing sounds in digital format, after receiving a representation of sounds detected by the external microphone, the control electronics 230 determines whether an amplitude of the detected sounds exceeds a sound amplitude threshold.

In addition to using a signal from the external microphone 260 to determine whether an amplitude of sounds detected by the external microphone 260 exceeds a sound amplitude threshold, the signal may also include information as to a measure of the effectiveness of the ANC system 200 in noise reduction. Instead of being one signal that includes both the measure of ambient sounds and the measure of the effectiveness of the ANC system 200 in noise reduction, the signal from the external microphone may also comprise multiple signals. For example, the signal from the external microphone 260 may comprise at least one signal used in determining whether an amplitude of sounds detected by the external microphone 260 exceeds a sound amplitude threshold and at least one signal indicating a measure of the effectiveness of the ANC system 200 in noise reduction.

The reference microphone 220, error microphone 240, and external microphone 260 may each be any acoustic wave sensor such as a microphone, vibration detector, or any other suitable device that detects a noise. In addition, the reference microphone 220, error microphone 240, and external microphone 260 may each comprise one or more microphones, for instance, multiple condenser microphones configured as an array and connected in parallel for more precise noise capture. The order of the placement of the components, 210-260, in the ANC system 200 is not limited to that shown in FIG. 2 and may be rearranged in any combination and/or order without departing from a scope of the ANC system 200 depicted therein. For example, the placement of the error microphone 240 with respect to the fan 210 may be switched by making corresponding changes in the noise-canceling algorithms.

In arranging the external microphone 260 with respect to the ANC system 200 of an electronic device, the external microphone 260 may be affixed to an exterior of an enclosure of the electronic device. Another place to arrange the external microphone 260 is as a part of another device close to a user, where the device is portable with respect to the enclosure of the electronic device and where the external microphone 260 is connected to the control electronics 230 of the electronic device via at least one of a wireless and wired connection. In placing the external microphone 260 within a portable device, the external microphone 260 may more accurately detect both the ambient sounds and ANC effectiveness in noise reduction because of the proximity of the external microphone 260 to the user.

The control electronics 230 and the speaker 250 may form an acoustic wave generator for receiving signals from the reference microphone 220 and the error microphone 240 and generating an anti-noise to reduce the noise detected by the microphones 220 and 240. In generating the anti-noise, the speaker 250 may be a speaker, vibration generator, or any other acoustic wave generator configured to generate an acoustic wave, such as anti-noise, sound tone, etc., and to reduce/counter all or some of the undesirable fan noise.

Specifically, the control electronics 230 may be any electronics that perform, implement, or execute one or more noise-canceling algorithms based on outputs from the reference microphone 220, the error microphone 240, and the external microphone 260. The noise-canceling algorithms performed within the control electronics 230 may include the generation and output of a signal to the speaker 250 for generating an acoustic wave to reduce the noise. More particularly, for instance, the control electronics 230 analyzes the noise captured by the reference microphone 220 and the error microphone 240 and creates a signal for creation of an anti-noise to be played back through the speaker 250.

In creating a signal for an anti-noise, the control electronics 230 also takes into consideration whether a signal from the external microphone 260 indicates that an amplitude of sounds detected by the external microphone 260 exceeds a sound amplitude threshold. If an amplitude of sounds detected by the external microphone 260 exceeds the threshold, the control electronics 230 may at least partially or completely power-down one or more components (for instance, 220, 240, 250 and 260) of the ANC system 200. By having at least a partial power-down of one or more components of the ANC system 200, the ANC system 200 saves power where noise reduction will have no discernable effect to a user because of loud ambient sounds present around the user.

In addition to considering a signal from the external microphone 260 in determining whether to at least partially power-down one or more components of the ANC system 200, the control electronics 230 may use an indication in the signal as to the effectiveness of the ANC system 200 in reducing noise to externally monitor ANC performance. Based on such external monitoring results, the ANC system 200 may further refine its ANC algorithms. For instance, when the control electronics 230 detects that a noise level detected by at least one of the reference microphone 220, error microphone 240, and external microphone 260 falls below a specific power-down threshold so that the noise will not be perceptible to a user, the control electronics may be designed to at least partially power down one or more components of the ANC system 200 and save power.

As to a physical make-up of the control electronics 230, functions of the control electronics 230 may be performed in one unitary device or multiple devices. In addition, or alternatively, some or all of the functions of the control electronics 230 may be distributed to one or more of the other components (for example, 220, 240, 250, and/or 260) the ANC system 200.

For arranging the error microphone 240, the speaker 250, and the external microphone 260 with respect to an electronic device and a user according to an example, the error microphone 240, the speaker 250, and the external microphone 260 may be directly located at the electronic device. In the same example, the user may be at some distance away from the electronic device. In another example, the error microphone 240 and the speaker 250 may be arranged at an electronic device, and the external microphone may be located in another device, which is portable with respect to the electronic device. The external microphone in the portable device may be connected to the control electronics 230 via a wireless or wired connection.

In both examples described above, the control electronics 230 and acoustic properties of the electronic device may be designed to minimize noise in the space surrounding the electronic device and not just at the location of the error microphone 240. For example, ANC algorithms may be tuned to minimize noise at the location of a user.

Figure 2B:
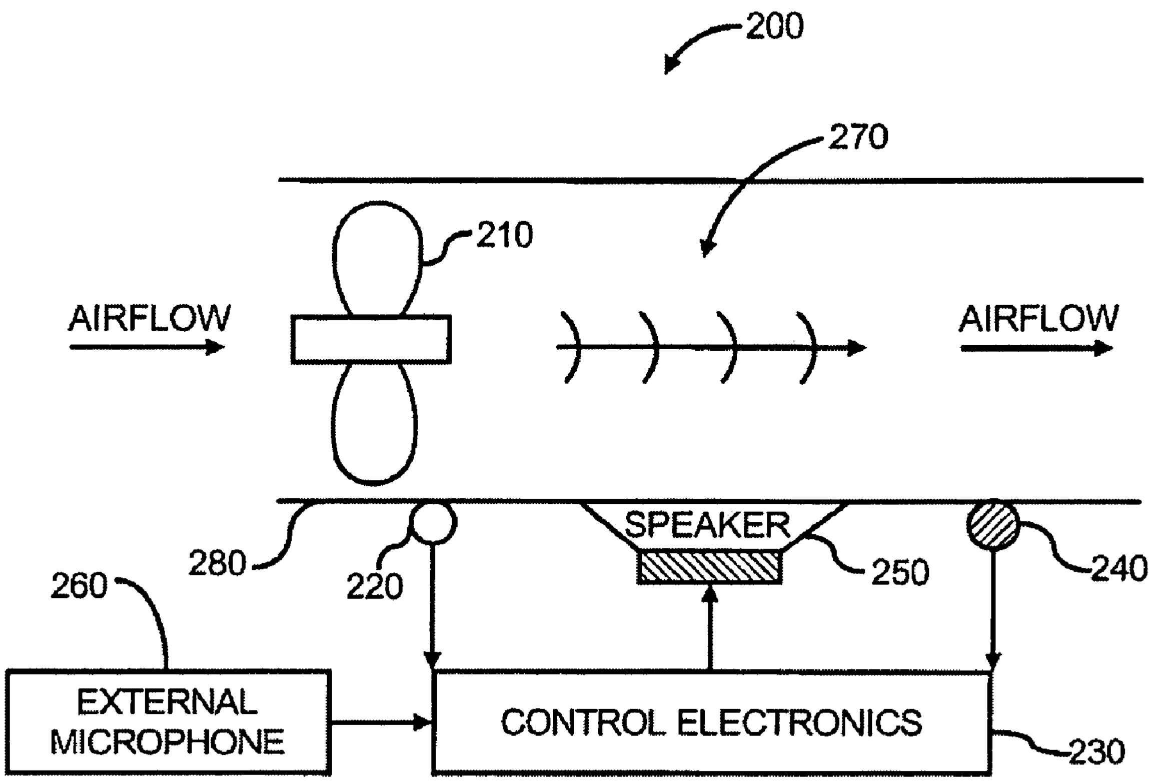
FIG. 2B illustrates a cross-sectional side view of a duct forming an airflow passageway and an ANC system having an external sensor according to an exemplary embodiment of the invention.

FIG. 2B illustrates a cross-sectional side view of a duct 280 forming an airflow passageway and having an external microphone 260 for the ANC system 200 according to an example. While operating as an airflow passageway, the duct 280 extends from an interior to an exterior of an enclosure of an electronic device (not shown) to pull or exhaust airflow into or from the enclosure, respectively, and to guide and shape noise wave-fronts. As a vent port, the duct 280 may be positioned, for instance, at one or more interfaces between an interior and an exterior of an electronic device.

As to the shaping of noise wave-fronts by the duct 280, a general concept exists that ANC may be more effectively applied when the noise, for instance, sound or vibration field, is ordered, confined or regulated to allow for better shaping of acoustic waves. Different shaping of a wave enclosure may cause the wave to behave in certain ways. For example, ANC may be more effectively and easily applied to a planar wave propagation than a three-dimensional propagation. In this regard, the duct 280 may be implemented to cause a noise to be propagated into a planar wave along the duct 280, as shown in FIG. 2B As also shown in FIG. 2B noise reduction may be performed after the noise wave is shaped in a two dimensional wave-front as the result of traveling within the duct 280. According to an example, effective reduction may occur within the self contained enclosure depicted in FIG. 2B prior to the wave propagating into a three dimensional space outside of the duct 280.

Specifically, when a noise created by the fan 210 travels through the duct 280, it propagates as a planar wave 270, which may be effectively and more easily reduced via ANC as described above. The fan 210 may comprise an internal fan positioned to direct heat away from a heat generating component, for instance.

The noise generated by the fan 210 is detected in the ANC system 200 by a reference microphone 220, which detects the noise and outputs a signal based on the noise to a control electronics 230. In response to receiving the signal from the reference microphone 220, the control electronics 230 outputs a signal to a speaker 250, which provides an anti-noise to reduce/counter the noise based upon the signal received from the control electronics 230. An error microphone 240 is used to detect the result of the noise-reduction and provides a signal corresponding to the detected result to the control electronics 230.

In addition to the above described operations of the control electronics 230, the control electronics 230 receives a signal from the external microphone 260 to determine whether an amplitude of sounds detected by the external microphone 260 exceeds a sound amplitude threshold. If a determination is made that an amplitude of sounds detected by the external microphone 260 exceeds the threshold, the control electronics 230 powers down one or more components of the ANC system 200 at least partially or completely. Such a power-down mode of the ANC system 200 saves power by avoiding use of power to reduce noise via ANC when such noise reduction would not be perceptible to a user because of loud ambient sounds present around the user.

Figure 2C:
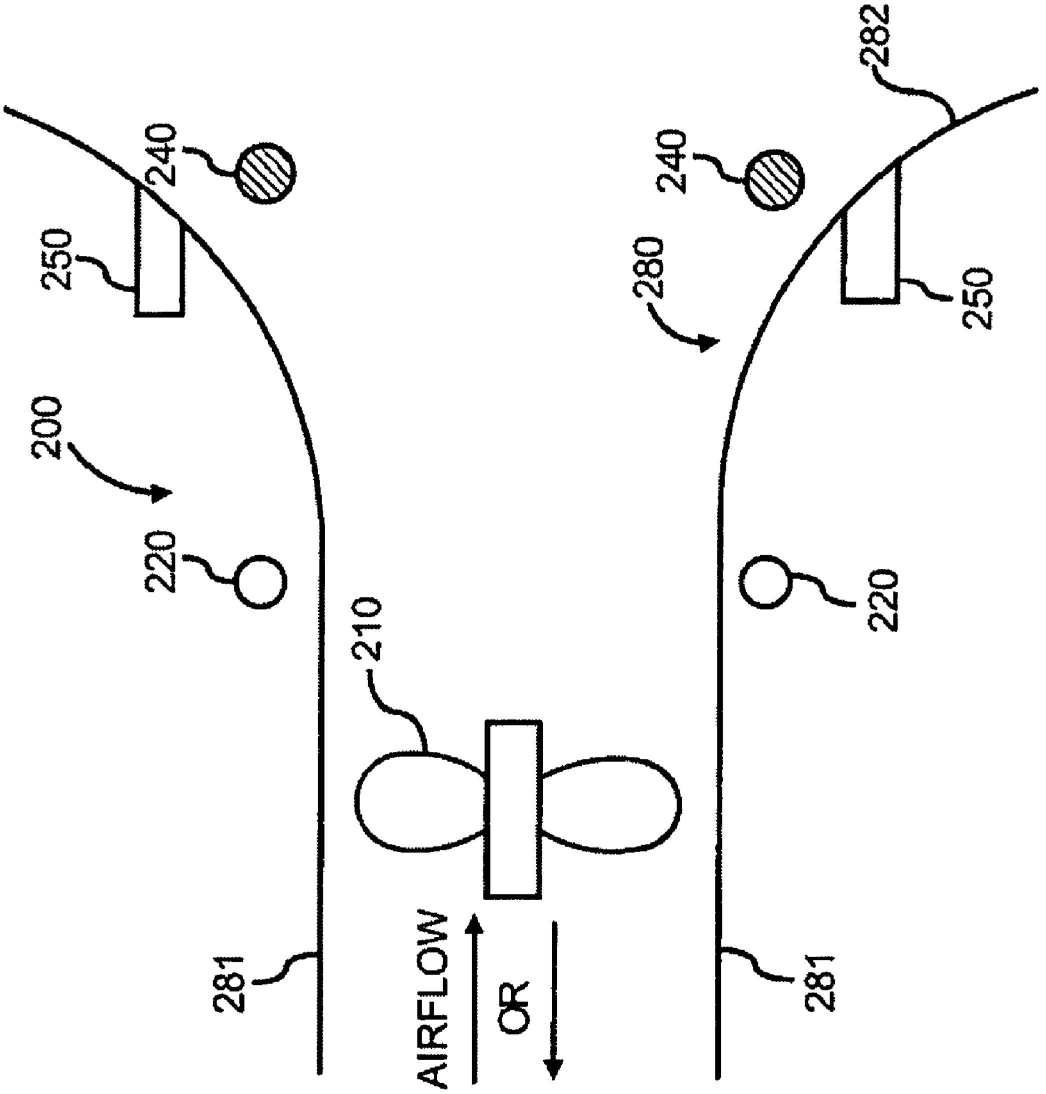
FIG. 2C illustrates a cross-sectional side view of a duct forming an airflow passageway according to an exemplary embodiment of the invention.

FIG. 2C illustrates a cross-sectional side view of a duct 280 forming an airflow passageway according to another example. The duct 280 as depicted in FIG. 2C is different from the duct in FIG. 2B in that they have different shapes, but one may be used interchangeably with the other without departing from a scope of the ANC system 200. Approximate positions of the reference microphone(s) 220, error microphone(s) 240 and anti-noise speaker(s) 250 with respect to the duct 280 are shown in FIG. 2B. The external sensor 260 and control electronics 230 are connected to other ANC system components 220, 240, and 250 via appropriate electrical connections.

As shown in FIG. 2C, the duct 280 has a pipe 281 and an end 282, in which the ends 282 have curved lips. At least by virtue of the configuration of the pipe 281 and the ends 282, air turbulence that would otherwise contribute to the broadband air rush noise is reduced. In one regard, the noise is reduced because the pipe 281 and the ends 282 do not contain sharp corners, which often create air turbulence and thus the air rush noise. According to an example, the duct 280 may lack (or have a relatively small number of) sharp corners and may have a minimum amount of obstructions in the airflow path.

The pipe 281 may comprise a straight pipe, slightly cone shaped pipe, or any other suitable shaped pipe that reduces the air turbulence through the pipe 281. The curved lips of the ends 282 may expand uniformly and gradually as they grow out of the pipe 281. Alternatively, however, the curved lips may have any other reasonably suitable configuration. Generally speaking, the curved lips of the ends 282 and the slight cone shaped configuration of the pipe 281 reduce air speed and the amount of air turbulence at the enclosure opening and thus reduce the broad air rush noise at the enclosure opening. The duct 280, if serving as an inlet port, may incorporate a fan 210 that pushes airflow into the enclosure and counterbalance a limited number of inlet ports and outlet ports while maintaining the cooling efficiency of the enclosure.

Figure 3:
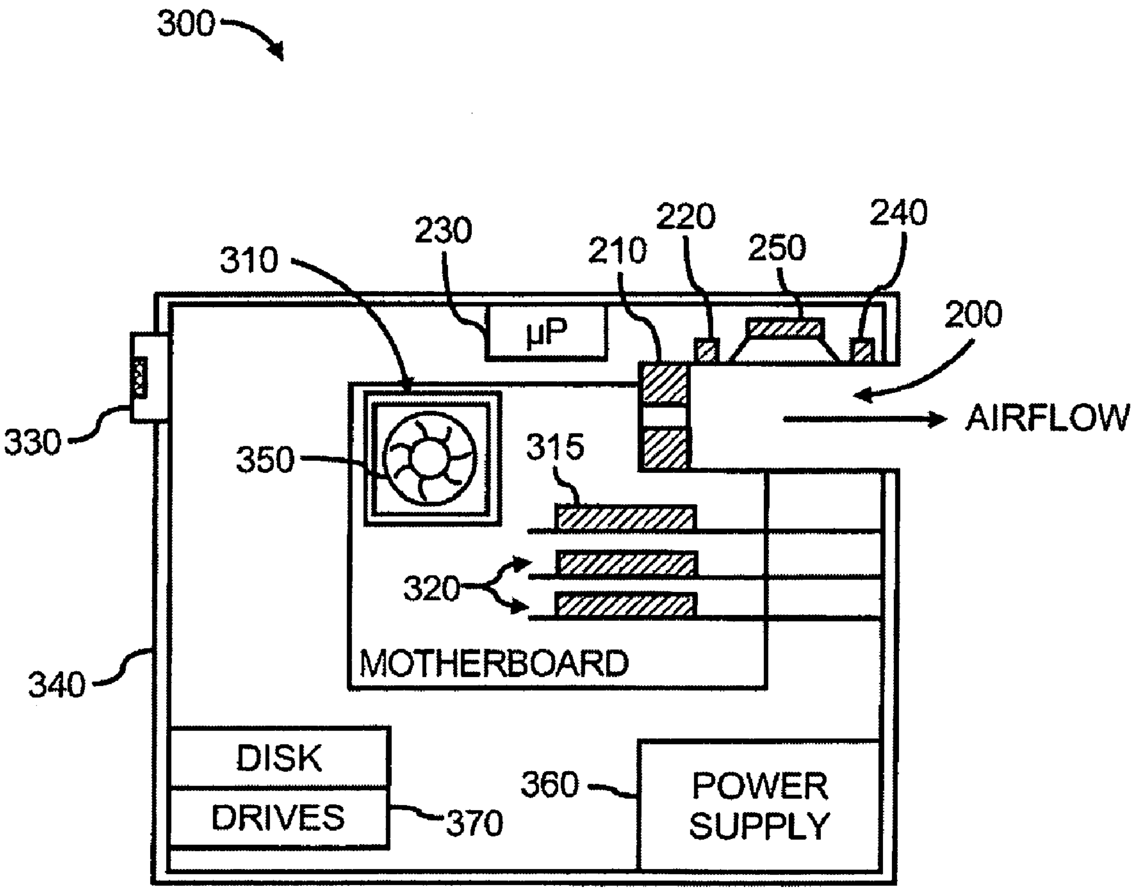
FIG. 3 illustrates a cross-sectional top view of an electronic device having an enclosure, where an external sensor for an ANC system is affixed to an exterior of the enclosure, according to an exemplary embodiment of the invention.

Turning now to FIG. 3, there shown is a cross-sectional top view of an electronic device 300 having an enclosure 340, where an external microphone 330 for the ANC system 200 is fixed to the enclosure 340, according to an example. As shown, the electronic device 300 depicted in FIG. 3 has an enclosure 340, which houses disk drives 370, a power supply 360, dual graphics-cards 320, with each comprising a graphics processing unit (GPU), and central processing units (CPUs) 315 attached to a heat sink 310. A purpose for attaching the heat sink 310 close to the CPUs 315 and GPUs 320 is to dissipate heat from the CPUs 315 and GPUs 320. The heat sink 310 is in turn provided with a cooling fan 350 to blow air over the heat sink 310 and dissipate heat therefrom.

Generally speaking, while the enclosure 340 for the electronic device 300 in FIG. 3 may contain a number of noise generating sources, the power supply 360 and the cooling fan 350 typically generate the most noise. Accordingly, the ANC system 200 applied in the enclosure 340 may focus on reducing noises from the power supply 360 and the cooling fan 350. Further, the ANC system 200 may be designed to adjust to various component changes, additions, and/or deletions from the enclosure 340. For instance, components within the enclosure 340 may change over time as users change, add or delete components, such as microprocessors, graphics cards, disk drives, etc. In accordance with such changes, additions or deletions of components, the ANC system 200 may be designed to adjust and optimize the algorithms. One way to aid such adjustment by the ANC system 200, while maintaining the effectiveness of the ANC system 200 in noise reduction, is by using multiple reference microphones 220 and multiple error microphones 240. By placing them in various strategically important places of the enclosure 340, the ANC system 200 may be designed to accurately detect noise and thus provide accurate noise detection results for the ANC system 200 throughout the period of changes in the combination of components within the enclosure 340.

As described above, the ANC system 200 detects a noise, reduces the noise, and detects a result of the noise reduction to control the ANC algorithms. To further assist the operations of the ANC system, the external microphone 330 detects sounds and provides a signal to the control electronics 230, which may be a microprocessor as shown in FIG. 3, of the ANC system 200. The signal from the external microphone 330 may be used to at least partially power down one or more components of the ANC system 200 when the control electronics 230 determines that an amplitude of sounds detected by the external microphone 330 exceeds a sound amplitude threshold. Such a power-down of the ANC system 200 saves power when noise reduction by the ANC system 200 will have no discernable effect to a user with loud sounds present around the user.

In addition to providing a measure of an amplitude of sounds detected by the external microphone 330, a signal generated by the external microphone 330 may also provide an indication as to the effectiveness of the ANC system 200 in noise reduction, which indication may be used by the ANC system 200 to further refine its ANC algorithms.

Figure 4:
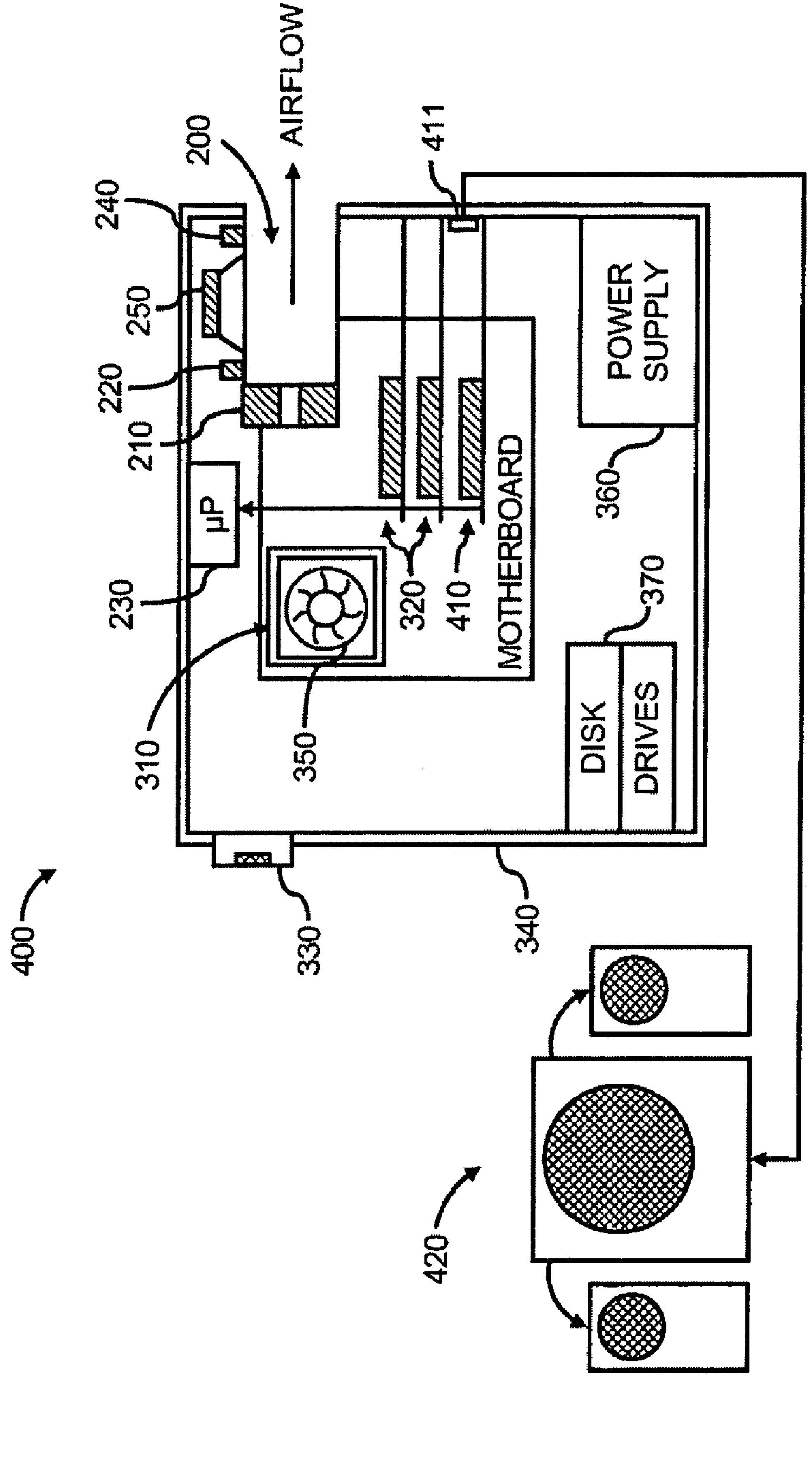
FIG. 4 illustrates a view of an electronic device in which a signal from a sound card is provided to control an ANC system according to an exemplary embodiment of the invention.

FIG. 4 illustrates a view of an electronic device 400 in which a signal from a sound card 410 is provided to control the ANC system 200 according to an example. In the example of FIG. 4, the sound card 410 outputs an audio signal for speakers 420 at an output node 411. The speakers 420 each receive the audio signal from the sound card 410 and generate user sounds in response to the audio signal from the sound card 410. While the speakers 420 in FIG. 4 are depicted as being outside of the enclosure 340 of the electronic device in FIG. 4, they may also be arranged inside the enclosure 340. For example, the speakers 420 may comprise the speaker 250 to generate both anti-noise and user sounds. In any case, at least some of the user sounds generated by the speakers 420 may be detected by the reference microphone 220 and the error microphone 240. If the ANC system 200 were not equipped with a mechanism to address the purposefully generated user sounds differently than noise, one outcome may be that the ANC system 200 will not be able to distinguish them and will waste energy trying to minimize purposefully generated user sounds. Another outcome is that the ANC algorithms may latch onto the user sounds and interpret them as the primary noise source, so that actual noise components are ignored and left unreduced in the operations of the ANC system 200.

One way of providing a mechanism to the ANC system 200 to distinguish user sounds from noise and treat them differently is by providing a signal from the sound card 410 to the control electronics 230 of the ANC system 200, as indicated by an arrow from the sound card 410 to the control electronics 230 as shown in FIG. 4, where the signal from the sound card 410 represents an audio signal provided to the speakers 420. By using the signal from the sound card 410, the control electronics 230 is able to distinguish between the user sounds and noise. Based on such method of distinction, the control electronics 230 generates an anti-noise to reduce/counter noise without reducing actual user sounds. The above described avoidance from using the ANC system 200 to reduce user sounds may be achieved by ignoring user sounds identified by the signal received with the control electronics 230 from the sound card 410 and/or by concentrating on reducing noise components of detected sounds instead of actual user sounds. By avoiding the use of the ANC system 200 to reduce purposefully generated user sounds, the ANC system 200 may optimize its ANC algorithms and save power.

Figure 5:
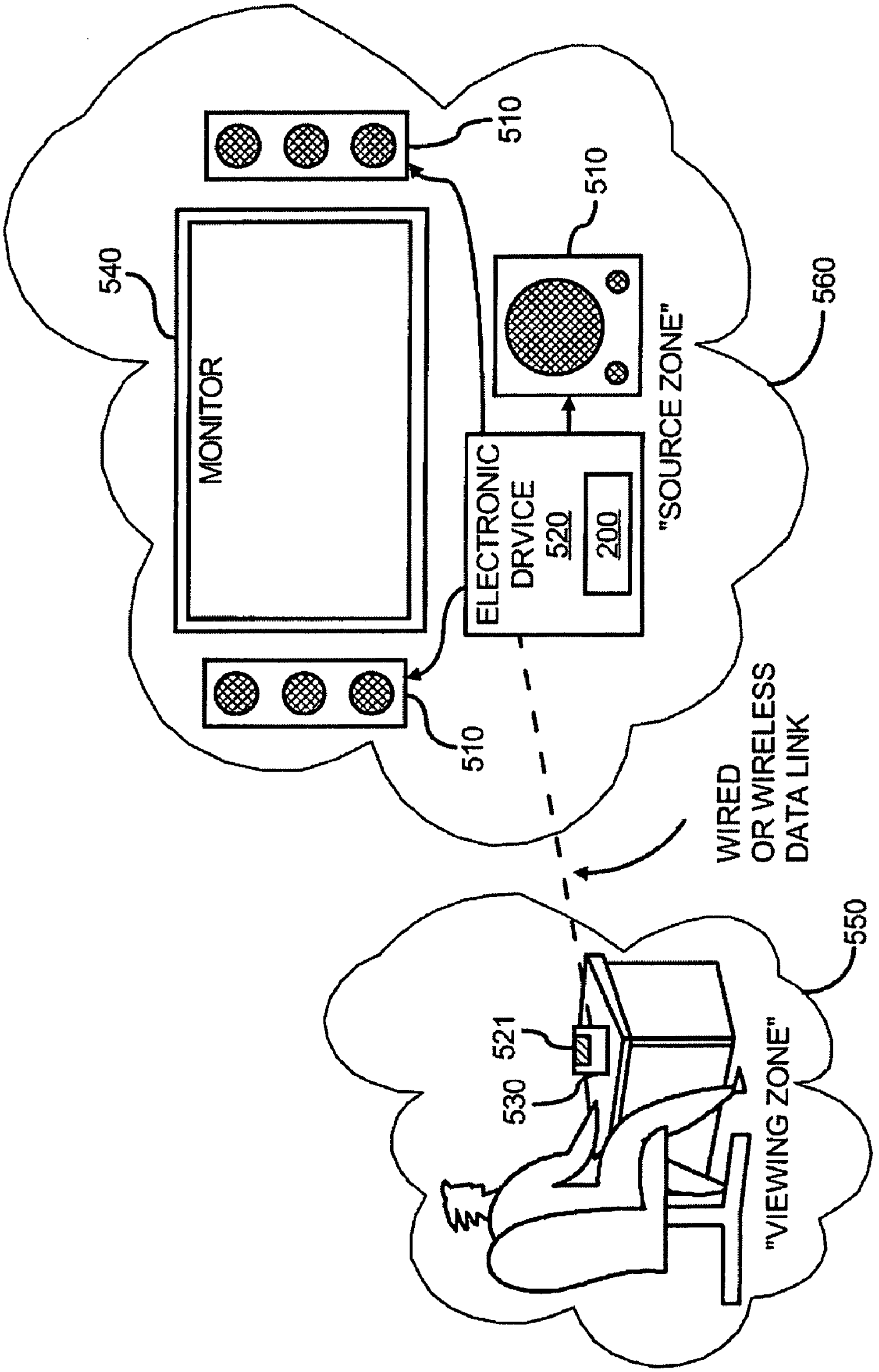
FIG. 5 illustrates an electronic device with ANC having an external sensor arranged in a portable device according to an exemplary embodiment of the invention.

FIG. 5 illustrates an electronic device 520 with an ANC system 200 and an external microphone 521 arranged in a portable device 530 according to an example. The external microphone 521 is a part of the ANC system 200 in the electronic device 520, which may be a computer as shown in FIG. 5, and forms a part of a second device 530. The second device 530 is portable with respect to the electronic device 520 and arranged in a viewing zone 550, where a user of a computer-driven entertainment center, which comprises speakers 510, the electronic device 520, and a monitor 540, is located. The electronic device 520 is located in a source zone 560 at some distance away from the viewing zone 550 and drives the speakers 510, monitor 540, etc.

With the close proximity of the external microphone 521 to a user, the ANC system 200 of the electronic device 520 may have a better understanding of user sounds/noise fields at the user's position and use such understanding to provide the user with a better listening experience. As described above, the external microphone 521 detects sounds around the user and generates a signal, where the signal from the external microphone 521 may be used in determining whether an amplitude of the detected sounds exceeds an amplitude threshold or in determining the effectiveness of the ANC system 200 in noise reduction. With such determinations, the ANC system 200 optimizes its performance and saves power. As to different types of the portable device 530, it may be a remote control for a television, a keyboard, a mouse or any other device that would reasonably ensure its proximity to the user while the user is using the electronic device 520.

While FIG. 5 discloses the external microphone 521 forming a part of the portable device 530, the external microphone 521 may also be a wearable device, which a user may wear as close as possible to his or her ears without being intrusive.

While embodiments of FIGS. 3-5 have been described in connection with a computer, the same duct, external microphone, and ANC arrangements shown in FIGS. 3-5 may be applied to other electronic devices such as projectors.

Figure 6:
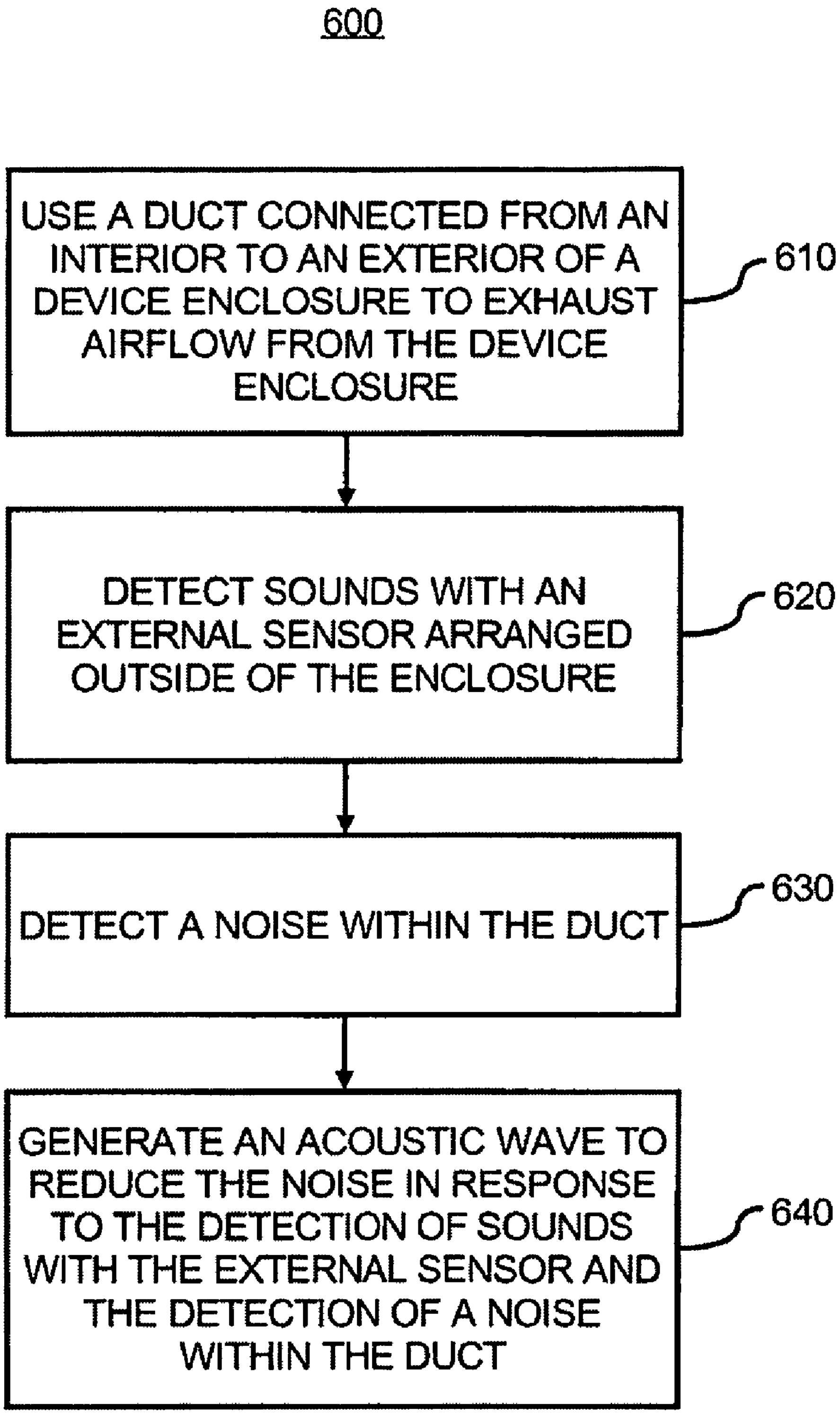
FIG. 6 illustrates a flowchart of a method for generating a wave to reduce a noise in response to a detection of sounds by an external sensor according an exemplary embodiment of the invention.

FIG. 6 illustrates a flowchart of a method 600 for generating a wave to reduce a noise in response to a detection of sounds by an external microphone according an example. It should be apparent to those of ordinary skill in the art that other steps may be added or existing steps may be removed, modified or rearranged without departing from a scope of the method 600.

At step 610, a duct (for example, the duct 280) connected from an interior to an exterior of a device enclosure (for example, the enclosure 340) is used to exhaust airflow from the device enclosure.

At step 620, sounds are detected with an external sensor arranged outside of the device enclosure. In addition, at step 630, a noise within the duct is detected, for example, by a reference microphone 220.

At step 640, an acoustic wave is generated, for example, by the anti-noise speaker 250, to reduce the noise in response to the detection of sounds with the external sensor and the detection of a noise within the duct.

In connection with the method 600, in response to receiving an electrical signal representative of purposefully generated user sounds from a source outputting an audio signal to a speaker for the purposeful generation of user sounds, the acoustic wave from step 640 may be generated to reduce the noise while factoring in the purposefully generated user sounds represented by the electrical signal. Further, one or more components of an active noise control mechanism (for example, the ANC system 200) may be powered down in response to a determination by the active noise control mechanism that an amplitude of the sounds detected via the electrical signal exceeds a sound amplitude threshold.

Any one or all of the exemplary features and embodiments of the invention may be applied and is incorporated in any and all of the embodiments of the invention unless clearly contradictory.

In each of the exemplary embodiment of the invention described above, any one or more of the following additional measures may be taken to reduce noise further.

For instance, one or more intermediate duct connecting an inlet duct to an outlet duct may be used to exhaust airflow from an enclosure of an electronic device and shape a noise wave-front to be more like a planar wave propagation as the noise propagates within the intermediate duct and more suitable for application of ANC at one or more inlet/outlet ducts 200.

Also, passive noise control mechanisms such as vibration/noise reducing foams may be used in critical places to improve noise-performance. Also, low speed fans producing BPF below human sensitivity may be used. Specifically, in applying the ANC, fan's rotational speed may be controlled by, for example, pulse-width-modulating a drive signal to the fan to provide a particular harmonic signature, that is the largest spectral components, to the noise the fan generates. By doing so, the noise may be provided with a known expected signal characteristic for which there is an effective noise-canceling algorithm. Also, the fan's rotational speed may be controlled to provide a noise with components that self-cancel or a noise without certain frequencies that are prone to resonance or are particularly difficult to cancel.

While the embodiments have been described with reference to examples, those skilled in the art will be able to make various modifications to the described embodiments without departing from the scope of the claimed embodiments.

What is claimed is:

1. An electronic device comprising:

an enclosure for the electronic device;

a duct extending from an interior to an exterior of the enclosure to exhaust airflow from the enclosure; and an active noise control mechanism comprising:

an internal sensor arranged within the enclosure to sense a noise and generate an internal sensor output;

an external sensor arranged outside of the enclosure to detect sounds and generate an external sensor output; and an acoustic wave generator to generate an acoustic wave within the duct to reduce the noise based upon the internal sensor output and the external sensor output, wherein the acoustic wave generator is to at least partially power down one or more components of the active noise control mechanism based on a determination that an amplitude of the sounds detected by the external sensor exceeds a sound amplitude threshold.

2. The electronic device of claim 1, wherein the acoustic wave generator is to receive an electrical signal representative of purposefully generated user sounds from a source outputting an audio signal to a speaker for the purposeful generation of user sounds and to generate the acoustic wave to reduce the noise while factoring in the purposefully generated user sounds represented by the electrical signal.

3. The electronic device of claim 1, wherein the external sensor is to generate a signal when an amplitude of the sounds detected by the external sensor exceeds the sound amplitude threshold.

4. The electronic device of claim 1, wherein the external sensor is affixed to an exterior of the enclosure.

5. The electronic device of claim 1, wherein the external sensor forms a part of another device, wherein said another device is portable with respect to the enclosure and is connected to the acoustic wave generator via at least one of a wireless and wired connection.

6. The electronic device of claim 1, further comprising a rotating device within the enclosure, wherein the active noise control mechanism is to reduce a noise from the rotating device.

7. The electronic device of claim 1, wherein the acoustic wave generator is to at least partially power down one or more components of the active noise control mechanism based on a determination by the acoustic wave generator that the noise falls below a power-down threshold.

8. The electronic device of claim 1, further comprising a mechanism in addition to the active noise control mechanism to reduce the noise.

9. A system for actively reducing noise of an electronic device comprising an enclosure having a duct extending from an interior to an exterior of the enclosure to exhaust airflow from the enclosure, the system comprising:

an internal sensor arranged to sense a noise and generate an internal sensor output;

an external sensor arranged outside of the enclosure to detect sounds and generate an external sensor output; and an acoustic wave generator to generate an acoustic wave within the duct to reduce the noise based on the internal sensor output and the external sensor output, wherein the acoustic wave generator is to at least partially power down one or more components of the active noise control mechanism based on a determination that an amplitude of the sounds detected by the external sensor exceeds a sound amplitude threshold.

10. The system of claim 9, wherein the acoustic wave generator is to receive an electrical signal representative of purposefully generated user sounds from a source outputting an audio signal to a speaker for the purposeful generation of user sounds and to generate the acoustic wave to reduce the noise while factoring in the purposefully generated user sounds represented by the electrical signal.

11. The system of claim 9, wherein the external sensor forms a part of another device, wherein said another device is portable with respect to the enclosure and connected to the acoustic wave generator via at least one of a wireless and wired connection.

12. A method comprising:

using a duct connected from an interior to an exterior of a device enclosure to exhaust airflow from the enclosure;

detecting sounds with an external sensor arranged outside of the device enclosure;

detecting a noise within the duct; and generating, using an active noise control mechanism, an acoustic wave to reduce the noise in response to the detection of sounds with the external sensor and the detection of a noise within the duct, at least partially powering down one or more components of the active noise control mechanism in response to a determination that an amplitude of the sounds detected by the external sensor exceeds a sound amplitude threshold.

13. The method of claim 12, further comprising generating, in response to receiving an electrical signal representative of purposefully generated user sounds from a source outputting an audio signal to a speaker for the purposeful generation of user sounds, the acoustic wave to reduce the noise while factoring the purposefully generated user sounds represented by the electrical signal.

* * * * *

UNITED STATES PATENT AND TRADEMARK OFFICE

CERTIFICATE OF CORRECTION

PATENT NO. : 8,331,577 B2
APPLICATION NO. : 12/250982
DATED : December 11, 2012
INVENTOR(S) : Geoff Lyon et al.

It is certified that error appears in the above-identified patent and that said Letters Patent is hereby corrected as shown below:

In column 12, line 37, in Claim 13, after "factoring" insert -- in --.

Signed and Sealed this
Second Day of April, 2013

Teresa Stanek Rea
*Acting Director of the United States Patent and Trademark Office*